United States Patent
Kaplan et al.

(10) Patent No.: US 10,522,733 B2
(45) Date of Patent: *Dec. 31, 2019

(54) MICROELECTROMECHANICAL APPARATUS FOR GENERATING A PHYSICAL EFFECT

(71) Applicant: AUDIO PIXELS LTD., Rehovot (IL)

(72) Inventors: Shay Kaplan, Givat Ela (IL); Yuval Cohen, Rehovot (IL); Meir Ben Simon, Givat Ela (IL)

(73) Assignee: AUDIO PIXELS LTD., Rehovot (IL)

( * ) Notice: Subject to any disclaimer, the term of this patent is extended or adjusted under 35 U.S.C. 154(b) by 644 days.

This patent is subject to a terminal disclaimer.

(21) Appl. No.: 15/290,510

(22) Filed: Oct. 11, 2016

(65) Prior Publication Data

US 2017/0033274 A1 Feb. 2, 2017

Related U.S. Application Data

(63) Continuation of application No. 14/021,152, filed on Sep. 9, 2013, now Pat. No. 9,510,103.

(51) Int. Cl.
*H04R 17/00* (2006.01)
*H01L 41/04* (2006.01)
(Continued)

(52) U.S. Cl.
CPC ........ *H01L 41/042* (2013.01); *G02B 26/0858* (2013.01); *H01L 41/0805* (2013.01);
(Continued)

(58) Field of Classification Search
CPC .................................................... H01L 41/042
See application file for complete search history.

(56) References Cited

U.S. PATENT DOCUMENTS 6,710,950 B2   3/2004   Rouvinen et al.
6,967,362 B2   11/2005  Nam et al.
(Continued)

FOREIGN PATENT DOCUMENTS

DE   3736896 A1   5/1989
GB   2467776 A    8/2010
(Continued)

*Primary Examiner* — Thomas M Dougherty
*Assistant Examiner* — Karen B Addison
(74) *Attorney, Agent, or Firm* — Browdy and Neimark, PLLC

(57) ABSTRACT

A microelectromechanical apparatus for generating a physical effect, including an array of moving elements, each coupled to a mechanical support by at least one flexure which is associated with at least one piezoelectric member which is operable to be strained by an electrical field applied to the piezoelectric member, thereby flexing the flexure to which the piezoelectric member is coupled; an electrical wiring, including a group of electrodes, wherein each electrode out of the group of electrodes is coupled to at least one of the piezoelectric members; wherein the electrical wiring is operable to concurrently transfer different sequences of electric fields to different piezoelectric members, thereby controllably inducing movement of moving elements of the array for creating the physical effect; and a motion restriction mechanism for maintaining a maximal motion distance for each of the moving elements when actuated via the corresponding flexure and piezoelectric member.

17 Claims, 5 Drawing Sheets

(51) Int. Cl.
   *G02B 26/08* (2006.01)
   *H01L 41/08* (2006.01)
   *H01L 41/09* (2006.01)

(52) U.S. Cl.
   CPC ......... *H01L 41/0973* (2013.01); *H04R 17/00* (2013.01); *H04R 17/005* (2013.01); *H04R 2201/003* (2013.01)

(56) References Cited

U.S. PATENT DOCUMENTS

| | | |
|---|---|---|
| 7,075,212 B2 | 7/2006 | Witteveen |
| 8,085,964 B2 | 12/2011 | Cohen et al. |
| 8,280,079 B2 | 10/2012 | Chung et al. |
| 8,401,220 B2 | 3/2013 | Kim et al. |
| 8,780,673 B2 | 7/2014 | Cohen et al. |
| 9,510,103 B2 * | 11/2016 | Kaplan .................. H04R 17/00 |
| 2004/0061543 A1 * | 4/2004 | Nam .................. B81C 1/00182 327/342 |
| 2005/0057120 A1 | 3/2005 | Nanataki et al. |
| 2005/0082946 A1 | 4/2005 | Takeuchi et al. |
| 2007/0019280 A1 | 1/2007 | Sasagawa et al. |
| 2010/0013574 A1 | 1/2010 | Huang |
| 2011/0080927 A1 | 4/2011 | Morikawa et al. |
| 2011/0169408 A1 | 7/2011 | Chen et al. |
| 2012/0076330 A1 | 3/2012 | Cohen et al. |
| 2012/0087522 A1 | 4/2012 | Lee et al. |
| 2015/0071467 A1 | 3/2015 | Kaplan et al. |
| 2015/0215706 A1 | 7/2015 | Sparks et al. |
| 2018/0098139 A1 | 4/2018 | Arevalo et al. |

FOREIGN PATENT DOCUMENTS

| | | |
|---|---|---|
| WO | 2007135678 A2 | 11/2007 |
| WO | 2009066290 A2 | 5/2009 |
| WO | 2010038229 A2 | 4/2010 |
| WO | 2011033028 A1 | 3/2011 |
| WO | 2011111042 A1 | 9/2011 |
| WO | 2012070042 A1 | 5/2012 |
| WO | 2013082169 A1 | 6/2013 |

* cited by examiner

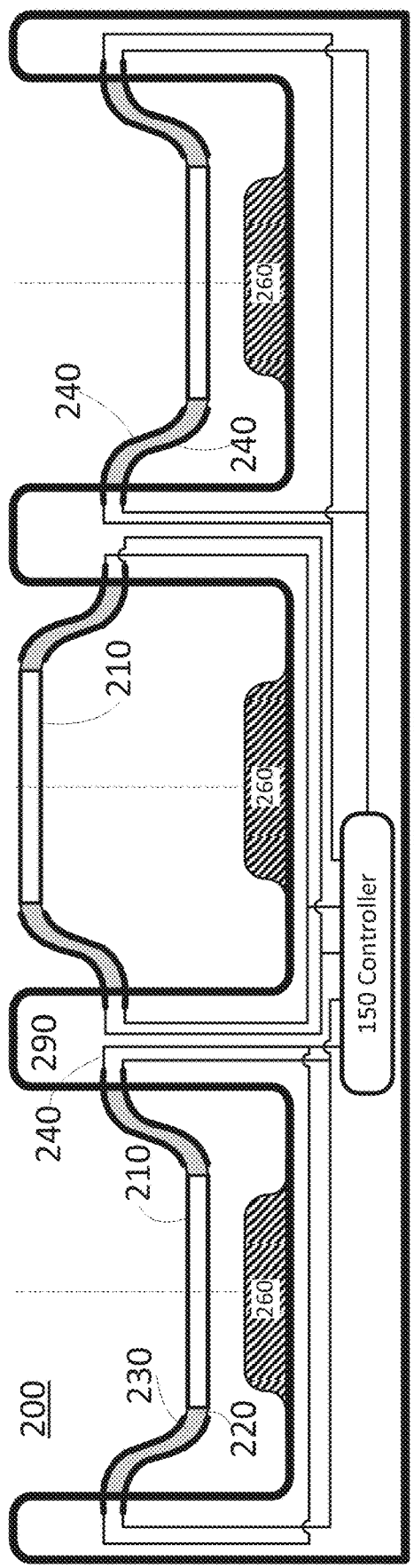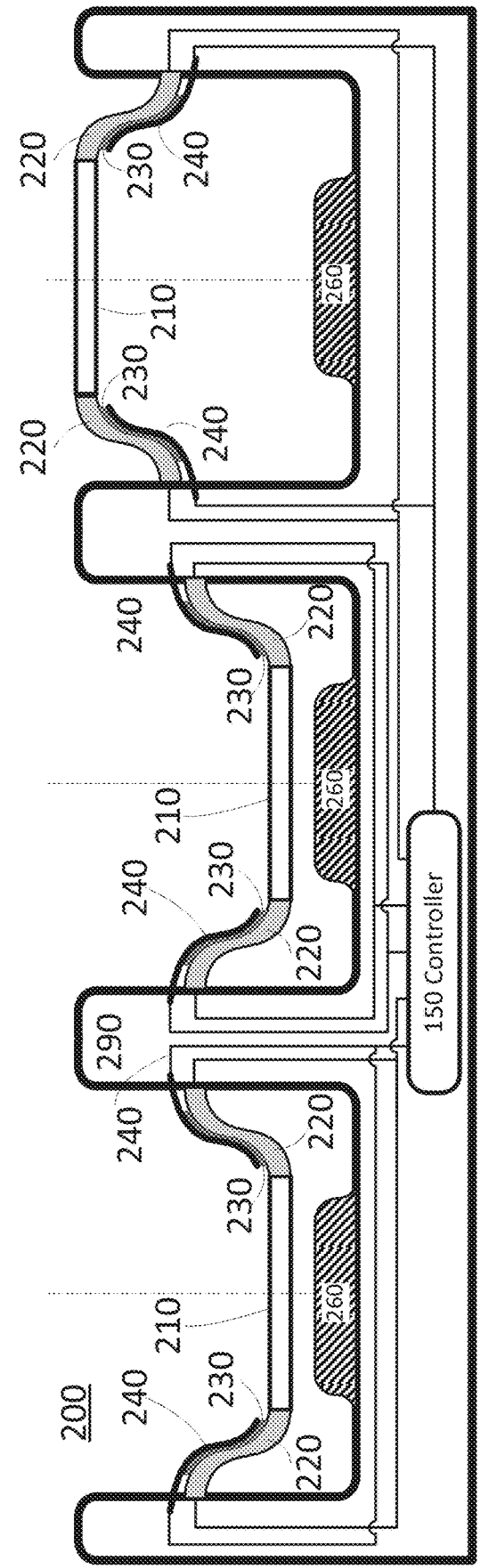

510 concurrently transferring over electrical wiring different sequences of electric fields to different piezoelectric members that are associated with different flexures, thereby controllably inducing movement of different moving elements of the microelectromechanical apparatus, wherein each of the moving elements is coupled by at least one of the flexures to a mechanical support 520 stopping by a mechanical stopper the movement of each moving element which reached a maximal motion distance for the moving element 522 holding the moving element against the mechanical stopper when the electric field applied to the respective piezoelectric member coupled to the moving element exceeds a threshold value

MICROELECTROMECHANICAL APPARATUS FOR GENERATING A PHYSICAL EFFECT

TECHNICAL FIELD

The presently disclosed subject matter relates to the field of microelectromechanical apparatuses and more specifically to microelectromechanical apparatuses for generating a physical effect.

BACKGROUND

Publications considered to be relevant as background to the presently disclosed subject matter are listed below. Acknowledgement of the publications herein is not to be inferred as meaning that these are in any way relevant to the patentability of the presently disclosed subject matter.

U.S. patent application Ser. No. US 2012008722 discloses a piezoelectric microspeaker and a method of fabricating the same. The piezoelectric microspeaker includes a substrate having a through hole therein; a diaphragm disposed on the substrate and covering the through hole; and a plurality of piezoelectric actuators including a piezoelectric member, a first electrode, and a second electrode, wherein the first and second electrodes are configured to induce an electric field in the piezoelectric member. The piezoelectric actuators include a central actuator, which is disposed on a central portion of the diaphragm and a plurality of edge actuators, which are disposed a predetermined distance apart from the central actuator and are formed on a plurality of edge portions of the diaphragm.

U.S. Pat. No. 8,280,079 discloses a piezoelectric microspeaker and a method of fabricating the same. In the piezoelectric microspeaker, a diaphragm includes a first region and a second region. The first region may be formed of a material capable of maximizing an exciting force, and the second region may be formed of a material having less initial stress and a lower Young's modulus than the first region.

U.S. Pat. No. 6,967,362 discloses a flexible wireless MEMS microphone which includes a substrate of a flexible polymeric material, a flexible MEMS transducer structure formed on the substrate by PECVD, an antenna printed on the substrate for communicating with an outside source, a wire and interface circuit embedded in the substrate to electrically connect the flexible MEMS transducer and the antenna, a flexible battery layer electrically connected to the substrate for supplying power to the MEMS transducer, and a flexible bluetooth module layer electrically connected to the battery layer. The flexible MEMS transducer includes a flexible substrate, a membrane layer deposited on the substrate, a lower electrode layer formed on the membrane layer, an active layer formed by depositing a piezopolymer on the lower electrode layer, an upper electrode layer formed on the active layer, and a first and a second connecting pad electrically connected to the lower and upper electrode layers, respectively.

GENERAL DESCRIPTION

In accordance with certain aspects of the presently disclosed subject matter, there is provided a microelectromechanical apparatus for generating a physical effect, the microelectromechanical apparatus including:
an array of moving elements, each of the moving elements coupled to a mechanical support by at least one flexure which is associated with at least one piezoelectric member which is operable to be strained by an electrical field applied to the piezoelectric member, thereby flexing the flexure to which the piezoelectric member is coupled;
an electrical wiring, including a group of electrodes, wherein each electrode out of the group of electrodes is coupled to at least one of the piezoelectric members; wherein the electrical wiring is operable to concurrently transfer different sequences of electric fields to different piezoelectric members, thereby controllably inducing movement of moving elements of the array for creating the physical effect; and
a motion restriction mechanism for maintaining a maximal motion distance for each of the moving elements when being actuated via the corresponding flexure and piezoelectric member.

In accordance with certain embodiments of the presently disclosed subject matter, there is further provided a microelectromechanical apparatus, wherein the motion restricting mechanism includes an array of mechanical stoppers associated with the respective array of moving elements, such that each of a plurality of the moving elements is operative to be constrained to travel alternately back and forth along a respective axis and is held against the mechanical stopper when the electric field applied to the respective piezoelectric member coupled to the respective moving element exceeds a threshold value.

In accordance with certain embodiments of the presently disclosed subject matter, there is yet further provided a microelectromechanical apparatus, further including a controller, operative to process a digital input signal and based on results of the processing to control an application of a sequence of electric fields for each out of a plurality of the piezoelectric members associated with at least two of the moving elements.

In accordance with certain embodiments of the presently disclosed subject matter, there is yet further provided a microelectromechanical apparatus, wherein for at least one of the flexures coupled to each out of a plurality of the moving elements, the flexure includes piezoelectric material and at least part of the flexure constitutes the at least one piezoelectric member associated with the flexure.

In accordance with certain embodiments of the presently disclosed subject matter, there is yet further provided a microelectromechanical apparatus, wherein the plurality of moving elements are made of the piezoelectric material In accordance with certain embodiments of the presently disclosed subject matter, there is yet further provided a microelectromechanical apparatus, wherein for at least one of the flexures coupled to each out of a plurality of the moving elements, at least a part of the flexure is made out of conductive material and constitutes at least a part of the electrode coupled to the piezoelectric member associated with the flexure.

In accordance with certain embodiments of the presently disclosed subject matter, there is yet further provided a microelectromechanical apparatus, wherein the physical effect is sound.

In accordance with certain embodiments of the presently disclosed subject matter, there is yet further provided a microelectromechanical apparatus, wherein the physical effect is redirecting of light.

In accordance with certain embodiments of the presently disclosed subject matter, there is yet further provided a microelectromechanical apparatus, wherein the physical effect is altering propagation time of light, thereby altering a phase of the light.

In accordance with certain aspects of the presently disclosed subject matter, there is yet further provided a microelectromechanical apparatus for generating a physical effect, the microelectromechanical apparatus including a moving element which is coupled to a mechanical support by at least one flexure which is associated with at least one piezoelectric member that is operable to be strained by an electrical field applied to the piezoelectric member, thereby flexing the flexure to which the piezoelectric member is coupled;

at least one electrode that is coupled to at least one of the piezoelectric members; the at least one electrode operable to transfer to the at least one piezoelectric member a sequences of electric fields, thereby controllably inducing movement of the moving element for creating the physical effect; and a mechanical stop, wherein the moving element is operative to be constrained to travel alternately back and forth along an axis, wherein the moving element is held against the mechanical stop when the electric field applied to at least one piezoelectric member coupled to the moving element exceeds a threshold value.

In accordance with certain embodiments of the presently disclosed subject matter, there is yet further provided a microelectromechanical apparatus, wherein the physical effect is sound.

In accordance with certain embodiments of the presently disclosed subject matter, there is yet further provided a microelectromechanical apparatus, further including a controller, operative to process a digital input signal and based on results of the processing to control an application of a sequence of electric fields for each of a plurality of the piezoelectric members.

In accordance with certain embodiments of the presently disclosed subject matter, there is yet further provided a microelectromechanical apparatus, wherein for at least one of the at least one flexure, the flexure includes piezoelectric material and at least part of the flexure constitutes the at least one piezoelectric member associated with the flexure.

In accordance with certain embodiments of the presently disclosed subject matter, there is yet further provided a microelectromechanical apparatus wherein the moving element is made of the piezoelectric material.

In accordance with certain embodiments of the presently disclosed subject matter, there is yet further provided a microelectromechanical apparatus, wherein for at least one of the flexures, at least a part of the flexure is made out of conductive material and constitutes at least a part of the electrode coupled to the piezoelectric member associated with the flexure.

In accordance with certain aspects of the presently disclosed subject matter, there is yet further provided a method for generating a physical effect by a microelectromechanical apparatus, the method including:

concurrently transferring over electrical wiring different sequences of electric fields to different piezoelectric members that are associated with different flexures, thereby controllably inducing movement of different moving elements of the microelectromechanical apparatus, wherein each of the moving elements is coupled by at least one of the flexures to a mechanical support; and stopping by a mechanical stopper the movement of each moving element which reached a maximal motion distance for the moving element.

In accordance with certain embodiments of the presently disclosed subject matter, there is yet further provided a method, wherein the stopping includes holding the moving element against the mechanical stopper when the electric field applied to the respective piezoelectric member coupled to the moving element exceeds a threshold value.

In accordance with certain embodiments of the presently disclosed subject matter, there is yet further provided a method, further including processing a digital input signal, generating a plurality of sequences of electric fields based on results of the processing, and controlling an application of different sequences of electric fields out of the plurality of sequences of electric fields to piezoelectric members associated with at least two of the moving elements.

In accordance with certain embodiments of the presently disclosed subject matter, there is yet further provided a method, wherein the physical effect is sound.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 5 is a side view diagram illustrating an example of a microelectromechanical apparatus, in accordance with the presently disclosed subject matter;

FIG. 6 is a side view diagram illustrating an example of a microelectromechanical apparatus, in accordance with the presently disclosed subject matter;

FIG. 7 is a generalized flowchart of a method for generating a physical effect by a microelectromechanical apparatus, in accordance with the subject matter of the present invention.

Figure 1:
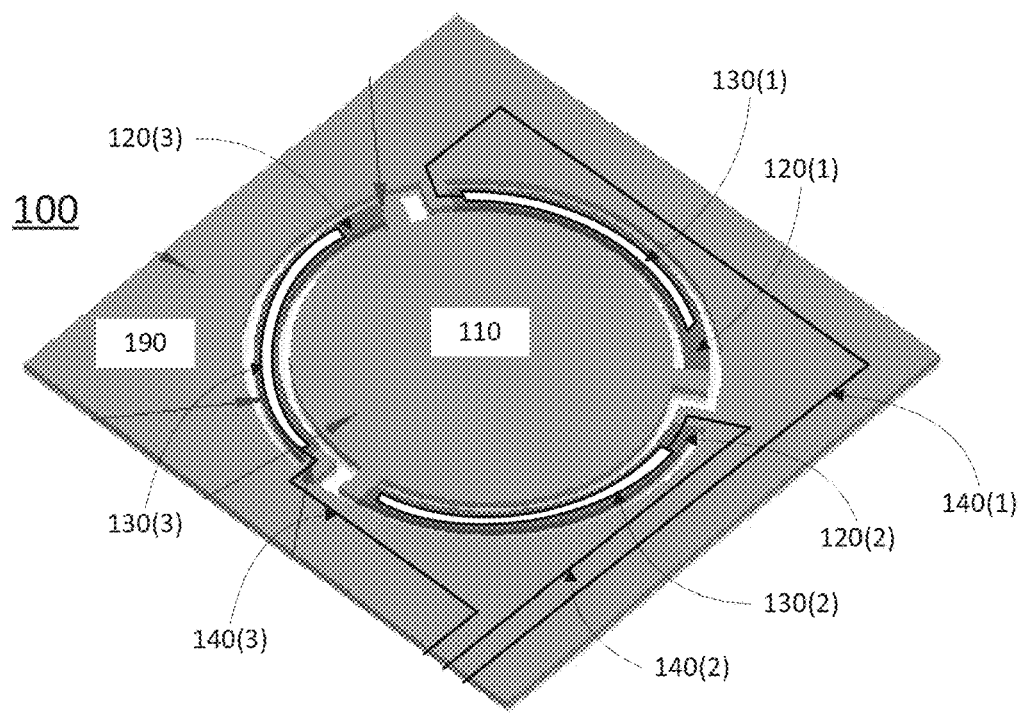
FIG. 1 is a diagram illustrating an example of a projection of a microelectromechanical apparatus, in accordance with the presently disclosed subject matter.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate identical or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known features, structures, characteristics, stages, methods, procedures, modules, components and systems, have not been described in detail so as not to obscure the present invention.

Unless specifically stated otherwise, as apparent from the following discussions, it is appreciated that throughout the specification discussions utilizing terms such as "processing", "calculating", "computing", "determining", "generating", or the like, include action and/or processes of a computer that manipulate and/or transform data into other data, said data represented as physical quantities, e.g. such as electronic quantities, and/or said data representing the physical objects. The terms "computer", "processor", and "controller" should be expansively construed to cover any kind of electronic device with data processing capabilities, or a part thereof. The term computer should be expansively construed to cover any kind of electronic device with data processing capabilities and which is made up of any combination of hardware, software and/or firmware and which includes at least some hardware, even if not labeled as such in the disclosure.

The operations in accordance with the teachings herein may be performed by a computer specially constructed for the desired purposes or by a general purpose computer specially configured for the desired purpose by a computer program stored in a non-transitory computer readable storage medium. The term "non-transitory" is used herein to exclude transitory, propagating signals, but to otherwise include any volatile or non-volatile computer memory technology suitable to the application.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

Reference in the specification to "one embodiment", "an embodiment", "some embodiments", "another embodiment", "other embodiments", "some other embodiments", "one instance", "an instance", "some instances", "another instance", "other instances", "some other instances", "one case", "a case", "some cases", "another case", "other cases", "some other cases", or variants thereof means that a particular feature, structure, characteristic, stage method, module described in connection with the embodiment(s) is included in at least one non-limiting embodiment of the presently disclosed subject matter. Thus the appearance of the phrase "one embodiment", "an embodiment", "some embodiments", "another embodiment", "other embodiments, "some other embodiments, "one instance", "an instance", "some instances", "another instance", "some other instances", "one case", "a case", "some cases", "another case", "other cases", "some other cases", or variants thereof does not necessarily refer to the same embodiment(s).

It is appreciated that, unless specifically stated otherwise, certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

Any trademark occurring in the text or drawings is the property of its owner and occurs herein merely to explain or illustrate one example of how the presently discussed subject matter may be implemented.

FIG. 1 is a diagram illustrating an example of a projection of microelectromechanical apparatus 100, in accordance with the presently disclosed subject matter. Microelectromechanical apparatus 100 is operable for generating a physical effect. For example, the physical effect may be sound, other types of pressure waves, reflection of light, and so on. It is noted that microelectromechanical apparatus 100 may serve as a subunit in a larger apparatus which is operable to generate a physical effect, such as microelectromechanical apparatus 200 discussed below. For example, microelectromechanical apparatus 200 may include a plurality of microelectromechanical apparatus 100 units, and in such a case, the physical effect generated by microelectromechanical apparatus 200 is generated at least from the physical effects generated by the plurality of microelectromechanical apparatus 100 units. Nevertheless, a single-unit microelectromechanical apparatus 100 that includes single unit may also be utilized for specific uses, as discussed with reference to FIG. 1. Some of the ways in which a microelectromechanical apparatus 200 which includes a plurality of units may be utilized are discussed below. For example, such a microelectromechanical apparatus 200 may be operated using a passive control matrix, as discussed below.

Microelectromechanical apparatus 100 (hereinafter also referred to as MEMS 100) includes moving element 110 which is connected to a mechanical support 190 by at least one flexure 120. It is noted that mechanical support 190 may be any stationary portion of microelectromechanical apparatus 100, such as a solid and rigid silicon layer. Stationary portions are not affected by the mechanical forces applied by the piezoelectric members which are applied for mobilizing moving element 110, or are at least affected to a degree sufficiently small, such that its effect on the generated physical effect is negligible (less than 1%).

It is noted that the term "flexure" is very well known in the art and should be construed in a non-limiting way as including (though not necessarily limited to) a flexure bearing, a spring and like mechanical components.

It is noted that the one or more flexures 120 may be implemented in various ways known in the art, such as a spring or a flexure bearing. More generally, the term "flexure"—which is very well known in the art—should be construed in a non-limiting way as including (though not limited to) a flexure bearing. It is noted that similar components may be referred to by different names, of which "flexure" is the one selected for reasons of convenience. A flexure bearing is a bearing which allows motion by a bending of a load carrying element. While not necessarily so, flexure 120 may be a flexure bearing which is made of a single part, joining two other parts (e.g. moving element 110 and mechanical support 190).

A flexure 120 of microelectromechanical apparatus 110 may be made from the same material as moving element 110, and possibly such a flexure 120 and moving element 110 may be manufactured as a single layer. A flexure 120 of microelectromechanical apparatus 110 may be made from the same material as mechanical support 190, and may possibly be manufactured as a single layer. Also, as illustrated in FIG. 1 for example—a flexure 120 of microelectromechanical apparatus 110 may be made from the same material as moving element 110 and as mechanical support 190, and may possibly be manufactured as a single layer. Each of the components 110, 120 and 190 may be made from a wide variety of materials, whether piezoelectric materials such as: BaTiO3, Sodium potassium niobate, Lead zirconate, polyvinylidene fluoride, and titanate, or other materials such as silicon, Titanium, epoxy-glass, and ceramic.

Some such combinations which may be implemented are:
(a) The moving element 110 as well as the one or more flexures 120 are made out of piezoelectric material and only the flexures 120 have actuating electrodes 140 on their surface.
(b) A non piezoelectric material moving element 110 supported by flexures 120 made from piezoelectric material.
(c) The moving element 110 as well as the one or more flexures 120 are made out of metal or silicon or other material, and the one or more flexures 120 have a layer of piezoelectric material on one or both faces, serving as piezoelectric member (or members) 130. For example, such a layer of piezoelectric material can be constructed from polymer piezoelectric material such as polyvinylidene fluoride.
(d) The moving element 110 as well as the one or more flexures 120 are made out of metal or silicon or other material, and the one or more flexures 120 have a layer of piezoelectric material on one or both faces, serving as piezoelectric member (or members) 130, where the flexure material serves as one electrode for the piezoelectric member that is deposited on one or both faces of the flexure 120.

Each of the one or more flexures 120 is associated with at least one piezoelectric member 130 that is operable to be strained by an electrical field applied to the respective piezoelectric member 130, thereby flexing the respective flexure 120 to which the piezoelectric member 130 is connected. Referring to the example illustrated in FIG. 1, in which each of the flexures 120(1), 120(2) and 120(3) is associated with a single piezoelectric member (130(1), 130(2) and 130(3) respectively), when electrical field E(i) is applied to piezoelectric member 130(i) (i∈{1,2,3} in the illustrated example), the respective piezoelectric member 130(i) is strained (i.e. contracted, expanded and/or bent). This straining of piezoelectric member 130(i) flexes the respective flexure 130(i). It is noted that the flexing of any one of the flexures 120 will result in movement of the moving element.

As discussed below, the straining of the one or more piezoelectric members 130 by the electrical field (or fields) applied thereto may be done in a controllable fashion, for producing a planned movement of moving element 110. For example, straining all of flexures 120(1), 120(2) and 120(3) to a similar degree would result in movement of moving element 110 perpendicularly to a plane of mechanical support 190, while a plane of moving element 110 remains parallel to that plane. Continuing the same example, straining flexures 120(1), 120(2) and 120(3) in different degrees and/or direction may be used for twisting moving element 110 between planes which are not parallel with respect to the plane of the mechanical support.

Microelectromechanical apparatus 100 also includes at least one electrode 140 that is connected to at least one of the piezoelectric members 130. It is noted that a single electrode 140 may be connected to a single piezoelectric member 130 (as illustrated) or to more than one of the piezoelectric members 130. Also—two or more electrodes 140 may be connected to any single piezoelectric member 130 (e.g. for transferring of current via the piezoelectric member 130, thereby applying an electric field onto the respective piezoelectric member 130).

Each of the one or more electrodes 140 is operable to transfer to the at least one piezoelectric member 130 a sequences of electric fields, thereby controllably inducing movement of the moving element 110 for creating the physical effect. It is noted that the one or more electrodes may be connected to a power source and/or to a controller, from which electric voltages may be applied to the electrodes for generating the electric fields straining the one or more piezoelectric members 130.

Figure 2:
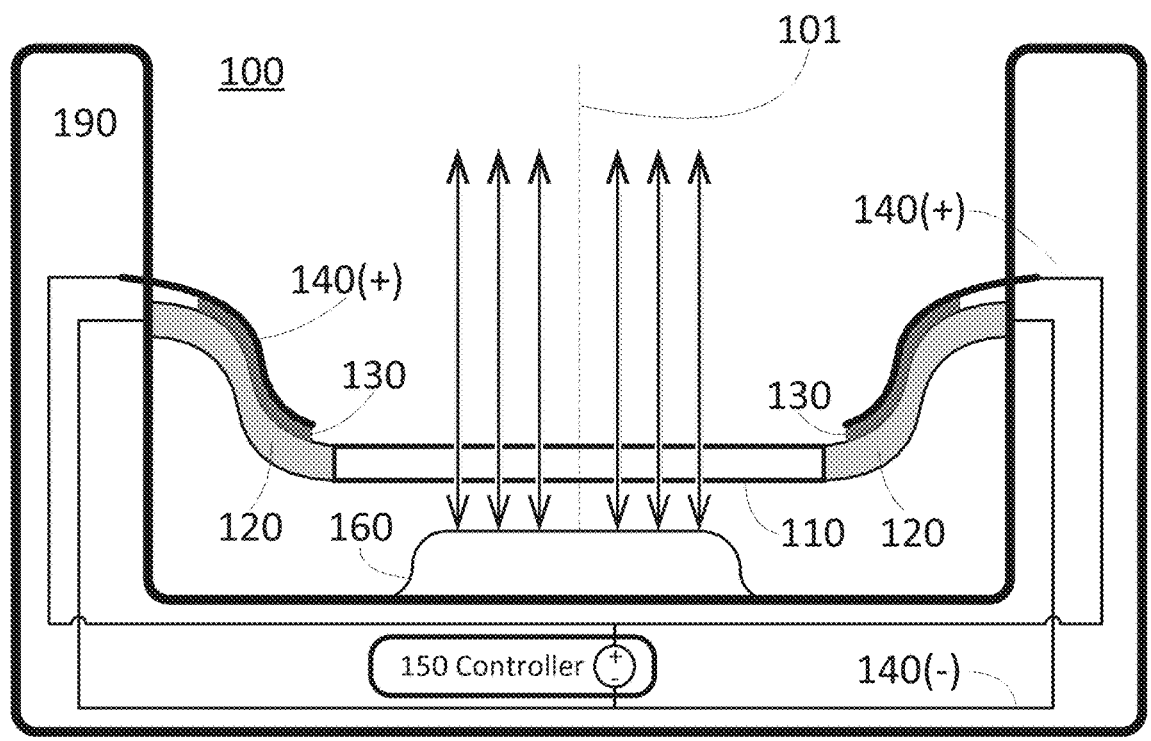
FIG. 2 is a side view diagram illustrating an example of a microelectromechanical apparatus, in accordance with the presently disclosed subject matter.

FIG. 2 is a side view diagram illustrating an example of microelectromechanical apparatus 100, in accordance with the presently disclosed subject matter. The one or more flexures 120 by which moving element 110 is connected to the mechanical support 190 may define an axis (denoted 101 in FIG. 2) along which the moving element 120 can travel. The structure of the flexures 120 and/or the control scheme according to which electric fields are applied to piezoelectric materials in microelectromechanical apparatus 100 may be implemented in order to prevent motion of moving element 120 in other directions (i.e. other than along the axis), i.e. moving element 110 may be operative to be constrained to travel alternately back and forth along an axis. It is noted that the same factors (structural and control related) may also define an at-rest position of the moving element 120 (e.g. in the same plane as that of mechanical support 190). Microelectromechanical apparatus 110 also includes one or more motion restriction mechanisms for maintaining a maximal motion distance for each of the moving elements when being actuated via the corresponding flexure and piezoelectric member.

For example, microelectromechanical apparatus 110 may include, as the motion restriction mechanism, one or more mechanical stops 160. More generally, the motion restricting mechanism may include an array of mechanical stoppers 160 associated with the respective array of moving elements, such that each of a plurality of the moving elements is operative to be constrained to travel alternately back and forth along a respective axis, and is held against the mechanical stopper 160 when the electric field applied to the respective piezoelectric member 130 connected to the respective moving element 110 exceeds a threshold value.

Such a mechanical stop 160 puts a limit to the motion of moving element 110 along the axis 101. When the electric field applied to at least one of the piezoelectric members 130 connected to the moving element 110 exceeds a threshold value, moving element 110 is held against the mechanical stop 160. It is noted that mechanical stops 160 may be implemented to limit the movement of moving element 110 at both ends of the movement along the axis (e.g. as exemplified in FIG. 3), or only at one of them (as illustrated for reasons of simplicity only in FIG. 5). The mechanical stop 160 may also be constructed such that the moving element 110 will stop in a position that is not parallel to the device surface.

Microelectromechanical apparatus 110 may optionally include a controller 150, which is operative to process a digital input signal and, based on results of the processing, to control an appliance of a sequence of electric fields for each out of a plurality of the piezoelectric members 130 (and possibly to all of them). This appliance of sequences of electric fields to the piezoelectric members 130 may result in the generation of the aforementioned physical effect resulting from the movement of some or all of the moving elements 110. It is noted that, prior to the controlling of the application of the sequences of electric fields, controller 150 preferably produces the respective sequences of electric fields based on the results of the processing of the digital input signal as discussed above.

Application of the sequence of electric fields may be executed by a component external to controller 150 (e.g. a dedicated electric driver), or by the controller itself. If, in addition to being operable and configured to control the application of the sequences of electric fields to the plurality of the piezoelectric members 130, the controller 150 is also configured to apply these sequences of voltages (e.g. directly to electrodes 140), then controller 150 should also be configured to be able to handle the required voltages. In other words, controller 150 may be capable of providing and/or switching relatively high voltages which are required to operate the piezoelectric material of the piezoelectric members 130.

The digital input signal may be stored in a tangible memory unit in controller 150 (or connected thereto), may be received from an external system, may be generated by controller 150, or any combination of the above.

The term "controller" as used herein should be expansively construed to cover any kind of electronic device with data processing capabilities, including, by way of non-limiting example, a personal computer, a server, a computing system, a communication device, a processor (e.g. digital signal processor (DSP), a microcontroller, a field programmable gate array (FPGA), an application specific integrated circuit (ASIC), etc.), any other electronic computing device, and or any combination thereof. The controller may be a part of the microelectromechanical apparatus, or external to it (whether on another microelectromechanical apparatus or otherwise).

As aforementioned, the physical effect which the microelectromechanical apparatus is operable to generate may be sound. More generally, microelectromechanical apparatus 100 may be a microelectromechanical apparatus for generating a physical effect having at least one attribute which corresponds to at least one characteristic of a digital input signal sampled periodically. For example, the physical effect may be sound and the attributes may be amplitude and/or frequency over sound waves.

Especially, the physical effect may be audible sound (it may also be ultrasound etc.). In such a case, the controller 150 may obtain a sound file (such as WAV file, MP3 file, Ogg Vorbis file, I2C, etc.), and to process it (e.g. to determine when the moving element 110 needs to be in a top position or a bottom position, or to determine when the moving element should be in movement upwards, in movement downwards or stationary). Based on the results of the processing, controller 150 may be configured to apply electric potentials to the electrodes 140 of microelectromechanical apparatus 100 based on the processing. As discussed with respect to microelectromechanical apparatus 200, the actual sound which resembles the original sound file may be generated by a group of microelectromechanical apparatuses 100, and not necessarily only by a single one. In such a case, each of the microelectromechanical apparatuses 100 may be referred to as a micro speaker element.

It is noted that the relationships between the flexures 120, the respective piezoelectric members 130 and the respective electrodes 140 may vary. For example, one or more of the flexures 120 may serve as an electrode 140 (e.g. as illustrated in FIG. 2). For example, one or more of the flexures 120 may serve as a respective piezoelectric member 130.

Figure 3:
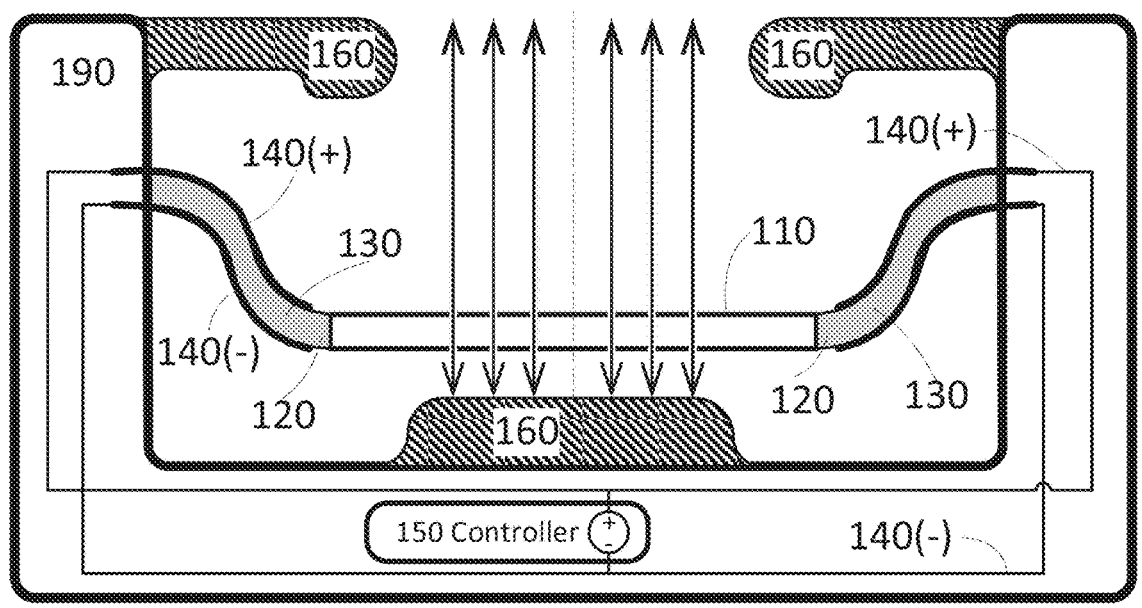
FIG. 3 is a side view diagram illustrating an example of a microelectromechanical apparatus, in accordance with the presently disclosed subject matter.

FIG. 3 is a side view diagram illustrating an example of microelectromechanical apparatus 100, in accordance with the presently disclosed subject matter. That is, optionally, for at least one of the at least one flexure 120, the flexure 120 includes piezoelectric material and at least part of the flexure 120 constitutes the at least one piezoelectric member 130 associated with the flexure 120. It is noted that even if the entire flexure 120 is made out of piezoelectric material, not necessarily all of it serves as a piezoelectric member 130. The parts of a flexure 120 which may serve as a piezoelectric member 130 for flexing the flexure 120 are such onto which controllable electric field may be applied (e.g. such which are sandwiched between electrodes 140). It is noted that optionally, moving element 110 may be made of the same piezoelectric material as the flexure 120 (if the latter is indeed at least partly made of piezoelectric material). In such a case, the electrodes 140 do not touch the parts of the piezoelectric material constituting moving element 110.

As aforementioned, optionally one or more of the flexures 120 may serve as an electrode 140. That is, optionally, for at least one of the flexures 120, at least a part of the flexure 120 is made out of conductive material and constitutes at least a part of the electrode 140 connected to the piezoelectric member 130 associated with the flexure.

The term "conductive" is well accepted in the art, and should be construed in a non-limiting way to refer to objects or to types of material which permit the flow of electric charges in one or more directions. For example, conductive surfaces may be fabricated from one or more electrically conductive materials such as the ones ordinarily used in the semiconductor industry.

Examples of piezoelectric materials which may be used for flexing flexures 140 in microelectromechanical apparatus 100 are, for example, BaTiO3, Sodium potassium niobate, polyvinylidene fluoride, and Lead zirconate titanate.

Alternatively to the examples shown in any one of FIGS. 1, 2, and 3, microelectromechanical apparatus 100 may in some examples include fewer, more and/or different modules than shown in these figures. Alternatively to the examples shown in any one of FIGS. 1, 2, and 3, the functionality of microelectromechanical apparatus 100 may in some examples be divided differently among the modules illustrated in the respective figures. Alternatively to the examples shown in any one of FIGS. 1, 2, and 3, the functionality of microelectromechanical apparatus 100 described herein may in some examples be divided into fewer, more and/or different modules than shown in the respective figures and/or microelectromechanical apparatus 100 may in some examples include additional, less, and/or different functionality than described herein.

Figure 4:
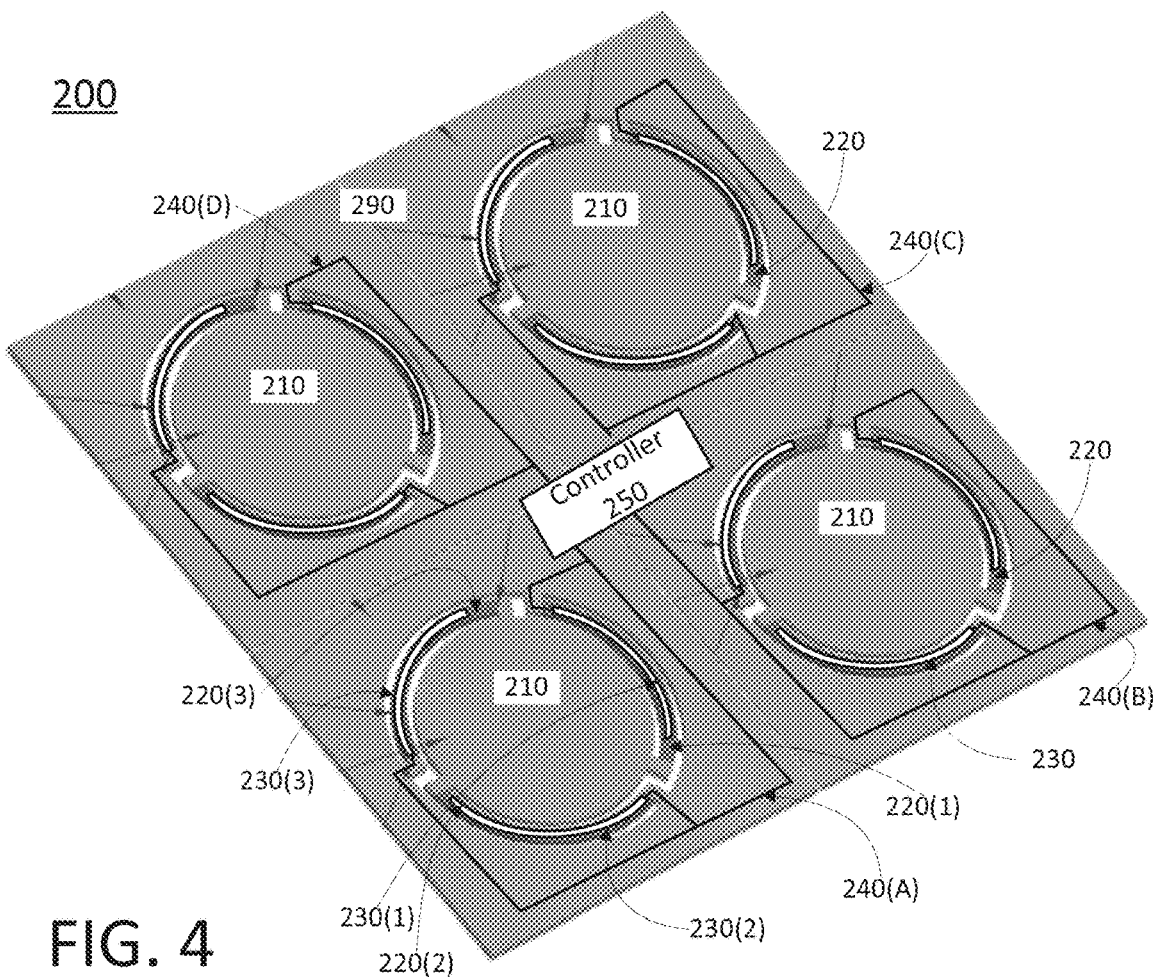
FIG. 4 is a diagram illustrating an example of a projection of a microelectromechanical apparatus, in accordance with the presently disclosed subject matter.

FIG. 4 is a diagram illustrating an example of a projection of microelectromechanical apparatus 200, in accordance with the presently disclosed subject matter. Microelectromechanical apparatus 200 is operable for generating a physical effect. For example, the physical effect may be sound, other types of pressure waves, reflection of light, and so on.

It is noted that microelectromechanical apparatus may include many substantially similar subunits such as microelectromechanical apparatus 100 discussed above. For example, microelectromechanical apparatus 200 may include a plurality of microelectromechanical apparatus 100 units, and in such a case, the physical effect generated by microelectromechanical apparatus 200 is generated at least from the physical effects generated by the plurality of microelectromechanical apparatus 100. However, this is not necessarily so.

Microelectromechanical apparatus 200 includes an array of moving elements 210, each of the moving elements connected to a mechanical support 290 by at least one flexure 220 which is associated with at least one piezoelectric member 230. Each of the at least one piezoelectric member 230 associated with the respective flexure is operable to be strained by an electrical field applied to that piezoelectric member 230, thereby flexing the flexure 220 to which the piezoelectric member 230 is connected.

Utilizing the proposed invention enables a separate control of each element of an array of piezo-electrically actuated actuators (such as the one of microelectromechanical apparatus 200), using a passive matrix approach as described in previously filed patent applications assigned to AUDIO PIXELS LTD, such as Patent Cooperation Treaty (PCT) patent applications serial numbers IL2007/000618, IL2008/001524, IL2011/000226, and IL2011/050018, all of which are incorporated herein in their entirety by reference. Different applications of such a separate control of each element of an array of piezo-electrically actuated actuators using a passive matrix may include, among others, utilizations in the fields of loudspeakers, parallel mirror arrays and deflecting mirror arrays.

Microelectromechanical apparatus 200 also includes an electrical wiring (not denoted), including a group of electrodes. Each electrode 240 out of the group of electrodes is connected to at least one of the piezoelectric members 230. The electrical wiring is operable to concurrently transfer to multiple piezoelectric members at least one sequence of electric fields, thereby controllably inducing movement of moving elements of the array for creating the physical effect.

Optionally, microelectromechanical apparatus 200 may also include a controller 250, which is operative to process a digital input signal, and based on results of the processing to control an appliance of a sequence of electric fields for each out of a plurality of the piezoelectric members associated with at least two of the moving elements. The controller 250 may be configured to control the appliance of the one or more sequences of electric fields such that the aforementioned physical effect represents the aforementioned signal.

More generally, microelectromechanical apparatus 200 may be a microelectromechanical apparatus for generating a physical effect having at least one attribute which corresponds to at least one characteristic of a digital input signal sampled periodically. For example, the physical effect may be sound and the attributes may be amplitude and/or frequency over sound waves.

Other utilizations include interacting with light rays. For example, the physical effect which the microelectromechanical apparatus is operable to generate may be redirecting of light. The redirecting of light may be achieved by mirrors or other micro-optical components which are connected to the different moving elements. Moving of these mirrors (or other optical components such as prisms or lenses) to different locations by controlling the electric fields applied to the piezoelectric members results in different optical characteristics of the microelectromechanical apparatus, and thereby to different redirection behavior with respect to incident rays of light.

In another example, the physical effect which the microelectromechanical apparatus is operable to generate may be altering propagation time of light, thereby altering a phase of the light. The altering of the propagation time of light may be achieved by mirrors or other micro-optical components which are connected to the different moving elements. Moving of these mirrors (or other optical components such as prisms or lenses) to different locations by controlling the electric fields applied to the piezoelectric members results in different optical behavior of the microelectromechanical apparatus, and thereby to different propagation times of incident rays of light.

Especially, the physical effect may be audible sound (it may also be ultrasound etc.). In such a case, the controller 250 may obtain and process as the digital input signal a sound file or real-time streaming sound signal data. Based on the results of the processing, controller 250 may be configured to apply electric potentials to the electrodes 240 of microelectromechanical apparatus 200 based on the processing. It is noted that the actual sound which resembles the original sound file may be generated by a group of microelectromechanical micro speaker elements (such as microelectromechanical apparatuses 100).

Optionally, the electrical wiring is operable to concurrently transfer different sequences of electric fields to different piezoelectric members, thereby controllably inducing movement of moving elements of the array for creating the physical effect.

Optionally, controller 250 may be configured to control a concurrent application (via the electrical wiring) of such different sequences of electric fields to different piezoelectric members, thereby controllably inducing movement of moving elements of the array for creating the physical effect.

The physical effect generated by microelectromechanical apparatus 200 may be determined by the number of moving elements 210 which are placed in each out of one or more different positions (e.g. top position, bottom position, middle position, etc.) and/or by the number of moving elements 210 which are in movement in each out of one or more directions and/or velocity (e.g. upwards motion, downwards motion, or stationary). For example, the magnitude of a pressure wave (such as a sound wave) at any moment may be determined by the difference between the number of moving elements 210 of the microelectromechanical apparatus 200 moving in one direction and the number of moving elements 210 going in the other direction.

Various techniques for controlling an apparatus which includes a plurality of moving elements have been developed by Audio Pixels LTD, the assignee of the present invention. Any of these techniques (as well as many others) may be used by controller 250. For example, controller 250 may implement any of the logical structures, physical structures, algorithms and processes which are disclosed in any of:

(a) Patent Cooperation Treaty patent application Serial number PCT/IL2011/050018 (entitled "Apparatus and Methods for Individual Addressing and Noise Reduction in Actuator Arrays");

(b) Patent Cooperation Treaty patent application Serial number PCT/IL2013/050444 (entitled "A System, a Method and a Computer Program Product for Controlling a Set of Actuator Elements"), (c) Patent Cooperation Treaty patent application Serial number PCT/IL2007/000621 (entitled "Volume and Tone Control in Direct Digital Speakers"); and (d) Patent Cooperation Treaty patent application Serial number IL2007/000618 (entitled "Direct Digital Speaker Apparatus Having a Desired Directivity Pattern"), all of which are incorporated herein in their entirety by reference.

As noted above, microelectromechanical apparatus 200 may be implemented as a micro-speaker array. A micro-speaker array performs better if the micro-speaker elements (and especially each moving element) can be addressed individually. This can be done using different techniques.

The most simple is to have a dedicated conductor for each element. This method takes up much space, and is therefore costly. Another method is to build the element array on top of an electronic circuit with individual contact to each element. Yet another method is an active matrix approach. In the active matrix configuration, each element has a switch, usually a transistor, that can be switched on or off using a matrix row column addressing. These last two options are costly if silicon is used as the electronics substrate. The active matrix can be an economic solution for most applications if thin-film transistor (TFT) technology is used. However, in some uses the voltages required for some electrostatic and piezoelectric actuation methods may be too high for TFT switching.

A Passive matrix is a good solution for many applications. In this technology, a row/column addressing is used and only elements that are located at a certain row/column address see the full voltage applied to the row/column. However, in electrostatic and piezoelectric actuation, it is impossible to leave an element in an actuated position when the matrix has to address another row/column at later steps/times, since when the voltages are switched off from the original row/column address, these elements will change their position.

A method for overcoming this is described in Patent Cooperation Treaty (PCT) patent application serial number IL2011/050018, which is incorporated herein in its entirety by reference, for use in electrostatic devices. This method operates due to hysteresis in the electrostatic actuator behavior. In a piezoelectric device, the same technique can be used if one uses mechanical stops to keep the device from moving further, even when the actuating voltage is increased. In this way, one can use a high voltage to move the moving element up to the stop and it will remain there even if the voltage is dropped, as long as the lower voltage is sufficient to drive the moving element to the mechanical stops.

It is noted that all of the functionalities, structures and variations discussed with respect to the components of microelectromechanical apparatus 100 may also be implemented for the respective components of microelectromechanical apparatus 200. For example, functionalities, structures and/or variations discussed with respect to flexures 120 may also be implemented for any one or more of the flexures 220 of microelectromechanical apparatus 200, and so on. It is noted that the corresponding reference numbers for each corresponding component in microelectromechanical apparatus 100 start with a 1 instead of 2 as the leftmost digit of the number.

FIG. 5 is a side view diagram illustrating an example of microelectromechanical apparatus 200, in accordance with the presently disclosed subject matter.

Thus, for example, optionally for at least one of the flexures 220 connected to each out of a plurality of the moving elements 210 (i.e. to two or more moving elements 210), the flexure 220 includes piezoelectric material and at least part of the flexure 220 constitutes the at least one piezoelectric member associated with the flexure (e.g. as demonstrated in FIG. 3 for a single moving element). Optionally, the moving elements 210 of this plurality of moving elements are made of the piezoelectric material.

FIG. 6 is a side view diagram illustrating an example of microelectromechanical apparatus 200, in accordance with the presently disclosed subject matter. Optionally, for at least one of the flexures 220 connected to each out of a plurality of the moving elements 210 (i.e. to two of more moving elements 210), at least a part of the flexure 220 is made out of conductive material and constitutes at least a part of the electrode 240 connected to the piezoelectric member 230 associated with the flexure.

As in microelectromechanical apparatus 100, mechanical stops may be implemented for any one or more of the moving elements 210 of microelectromechanical apparatus 200—at either one end of its motion, or at both ends. Optionally, for each moving element out of a plurality of the moving elements 210, the moving element 210 is operative to be constrained to travel alternately back and forth along a respective axis, and the microelectromechanical apparatus 220 includes at least one mechanical stop 260 against which the moving element 210 is held when the electric field applied to at least one piezoelectric member 230 connected to that moving element 210 exceeds a threshold value.

Alternatively to the examples shown in any one of FIGS. 4, 5, and 6, microelectromechanical apparatus 200 may in some examples include fewer, more and/or different modules than shown in these figures. Alternatively to the examples shown in any one of FIGS. 4, 5, and 6, the functionality of microelectromechanical apparatus 200 may in some examples be divided differently among the modules illustrated in the respective figures. Alternatively to the examples shown in any one of FIGS. 4, 5, and 6, the functionality of microelectromechanical apparatus 200 described herein may in some examples be divided into fewer, more and/or different modules than shown in the respective figures and/or microelectromechanical apparatus 200 may in some examples include additional, less, and/or different functionality than described herein.

As is demonstrated by way of example in FIGS. 5 and 6, the moving elements 210 may be controlled independently of each other (or in groups), so that different moving elements 210 may be in different states at the same time.

FIG. 7 is a generalized flowchart of method 500 for generating a physical effect by a microelectromechanical apparatus, in accordance with the subject matter of the present invention. Referring to the examples set forth with respect to the previous drawings, method 500 may be carried out by a microelectromechanical apparatus such as microelectromechanical apparatus 200.

Method 500 includes stage 510 of concurrently transferring over electrical wiring different sequences of electric fields to different piezoelectric members that are associated with different flexures, thereby controllably inducing movement of different moving elements of the microelectromechanical apparatus, wherein each of the moving elements is coupled by at least one of the flexures to a mechanical support. Referring to the examples set forth with respect to the previous drawings, stage 510 may be carried out by a controller such as controller 150, possibly in combination with one or more of the electrodes 140.

Method 500 also includes stage 520 of stopping by a mechanical stopper the movement of each moving element which reached a maximal motion distance for the moving element. Referring to the examples set forth with respect to the previous drawings, stage 520 may be carried out by an array of mechanical stoppers such as mechanical stoppers 160. It is noted that stage 520 may be executed concurrently with stage 510 (e.g. some moving elements may be stopped while other moving elements travel under the effect of application of the electrical fields).

It is noted that the stopping of stage 520 may include holding the moving element against the mechanical stopper when the electric field applied to the respective piezoelectric member coupled to the moving element exceeds a threshold value (denoted stage 522).

Figure 8:
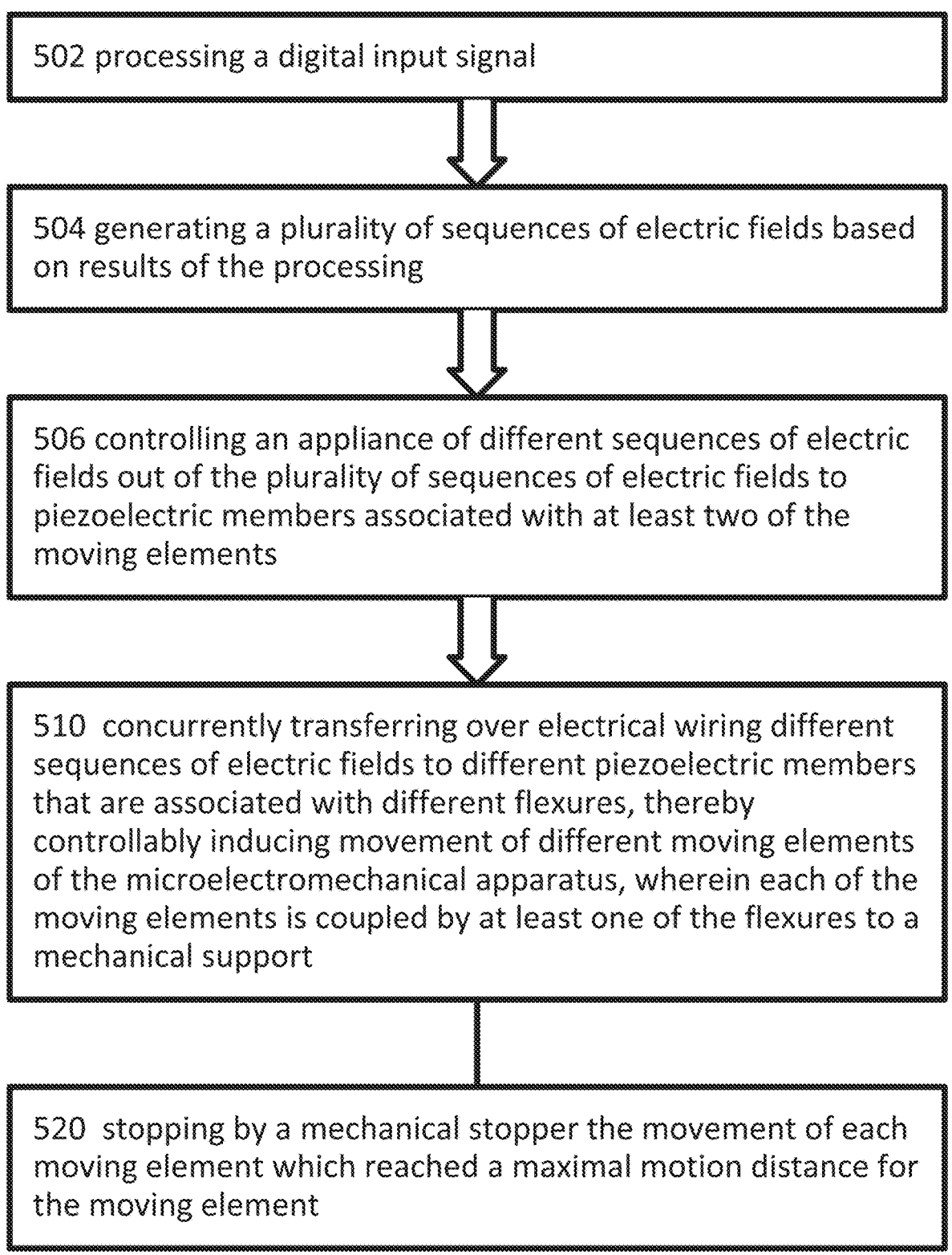
FIG. 8 is a generalized flowchart of a method for generating a physical effect by a microelectromechanical apparatus, in accordance with the subject matter of the present invention.

FIG. 8 is a generalized flowchart of method 500 for generating a physical effect by a microelectromechanical apparatus, in accordance with the subject matter of the present invention.

Method 500 may also include stage 502 of processing a digital input signal, stage 504 of generating a plurality of sequences of electric fields based on results of the processing, and stage 506 of controlling an appliance of different sequences of electric fields out of the plurality of sequences of electric fields to piezoelectric members associated with at least two of the moving elements. Referring to the examples set forth with respect to the previous drawings, stages 502, 504 and 506 may be carried out by a controller such as controller 150.

Referring to method 500 as a whole, it is noted that while not necessarily so, the generated physical effect may be sound (e.g. audible sound, ultrasound).

While not necessarily so, the process of operation of the previously discussed microelectromechanical apparatus 200 may correspond to some or all of the stages of method 500 and any of its variations. Likewise, method 500 and any of its stages and their possible implementations may possibly be implemented by a system such as microelectromechanical apparatus 200, and the respective components mentioned with respect to each of the stages.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It will be appreciated that the embodiments described above are cited by way of example, and various features thereof and combinations of these features can be varied and modified.

While various embodiments have been shown and described, it will be understood that there is no intent to limit the invention by such disclosure, but rather, it is intended to cover all modifications and alternate constructions falling within the scope of the invention, as defined in the appended claims.

What is claimed is:

1. A microelectromechanical apparatus for generating a physical effect, the microelectromechanical apparatus comprising:
   an array of moving elements, each of the moving elements being constructed of a non-piezoelectric material and being coupled to a mechanical support by at least one flexure which is associated with at least one piezoelectric member which is operable to be strained by an electrical field applied to the piezoelectric member, thereby flexing the flexure to which the piezoelectric member is coupled;
   an electrical wiring, comprising a group of electrodes, wherein each electrode out of the group of electrodes is coupled to at least one of the piezoelectric members; wherein the electrical wiring is operable to concurrently transfer different sequences of electric fields to different piezoelectric members, thereby controllably inducing movement of moving elements of the array for creating the physical effect; and
   a motion restriction mechanism for maintaining a maximal motion distance for each of the moving elements when being actuated via the corresponding flexure and piezoelectric member.

2. The microelectromechanical apparatus according to claim 1, wherein the motion restricting mechanism comprises an array of mechanical stoppers associated with the respective array of moving elements, such that each of a plurality of the moving elements is operative to be constrained to travel alternately back and forth along a respective axis and is held against the mechanical stopper when the electric field applied to the respective piezoelectric member coupled to the respective moving element exceeds a threshold value.

3. The microelectromechanical apparatus according to claim 1, further comprising a controller, operative to process a digital input signal and based on results of the processing to control an application of a sequence of electric fields for each out of a plurality of the piezoelectric members associated with at least two of the moving elements.

4. The microelectromechanical apparatus according to claim 1, wherein for at least one of the flexures coupled to each out of a plurality of the moving elements, the flexure comprises piezoelectric material and at least part of the flexure constitutes the at least one piezoelectric member associated with the flexure.

5. The microelectromechanical apparatus according to claim 1, wherein for at least one of the flexures coupled to each out of a plurality of the moving elements, at least a part of the flexure is made out of conductive material and constitutes at least a part of the electrode coupled to the piezoelectric member associated with the flexure.

6. The microelectromechanical apparatus according to claim 1, wherein the physical effect is sound.

7. The microelectromechanical apparatus according to claim 1, wherein the physical effect is redirecting of light.

8. The microelectromechanical apparatus according to claim 1, wherein the physical effect is altering propagation time of light, thereby altering a phase of the light.

9. A microelectromechanical apparatus for generating a physical effect, the microelectromechanical apparatus comprising:
   a moving element that is constructed of a non-piezoelectric material, said moving element being coupled to a mechanical support by at least one flexure which is associated with at least one piezoelectric member that is operable to be strained by an electrical field applied to the piezoelectric member, thereby flexing the flexure to which the piezoelectric member is coupled;

at least one electrode that is coupled to at least one of the piezoelectric members; the at least one electrode operable to transfer to the at least one piezoelectric member a sequence of electric fields, thereby controllably inducing movement of the moving element for creating the physical effect; and a mechanical stop, wherein the moving element is operative to be constrained to travel alternately back and forth along an axis, wherein the moving element is held against the mechanical stop when the electric field applied to at least one piezoelectric member coupled to the moving element exceeds a threshold value.

10. The microelectromechanical apparatus according to claim 9, wherein the physical effect is sound.

11. The microelectromechanical apparatus according to claim 9, further comprising a controller, operative to process a digital input signal and based on results of the processing to control an application of a sequence of electric fields for each of a plurality of the piezoelectric members.

12. The microelectromechanical apparatus ac according to claim 9, wherein for at least one of the at least one flexure, the flexure comprises piezoelectric material and at least part of the flexure constitutes the at least one piezoelectric member associated with the flexure.

13. The microelectromechanical apparatus according to claim 9, wherein for at least one of the flexures, at least a part of the flexure is made out of conductive material and constitutes at least a part of the electrode coupled to the piezoelectric member associated with the flexure.

14. A method for generating a physical effect by a microelectromechanical apparatus, the method comprising:

concurrently transferring over electrical wiring different sequences of electric fields to different piezoelectric members that are associated with different flexures, thereby controllably inducing movement of different moving elements of the microelectromechanical apparatus, wherein each of the moving elements is coupled by at least one of the flexures to a mechanical support, and wherein each of the moving elements is constructed of a non-piezoelectric material; and stopping by a mechanical stopper the movement of each moving element which reached a maximal motion distance for the moving element.

15. The method according to claim 14, wherein the stopping comprises holding the moving element against the mechanical stopper when the electric field applied to the respective piezoelectric member coupled to the moving element exceeds a threshold value.

16. The method according to claim 14, further comprising processing a digital input signal, generating a plurality of sequences of electric fields based on results of the processing, and controlling an application of different sequences of electric fields out of the plurality of sequences of electric fields to piezoelectric members associated with at least two of the moving elements.

17. The method according to claim 14, wherein the physical effect is sound.

* * * * *

UNITED STATES PATENT AND TRADEMARK OFFICE
CERTIFICATE OF CORRECTION

PATENT NO. : 10,522,733 B2
APPLICATION NO. : 15/290510
DATED : December 31, 2019
INVENTOR(S) : Shay Kaplan Page 1 of 1

It is certified that error appears in the above-identified patent and that said Letters Patent is hereby corrected as shown below:

In the Claims

At Claim 12, Column 17, Line 22, delete "ac".

Signed and Sealed this
Twenty-third Day of June, 2020

Andrei Iancu
*Director of the United States Patent and Trademark Office*